(12) United States Patent
Zhang et al.

(10) Patent No.: US 11,990,900 B2
(45) Date of Patent: May 21, 2024

(54) ZQ RESISTOR CALIBRATION CIRCUIT IN MEMORY DEVICE AND CALIBRATION METHOD THEREOF

(71) Applicant: YANGTZE MEMORY TECHNOLOGIES CO., LTD., Wuhan (CN)

(72) Inventors: Huangpeng Zhang, Wuhan (CN); Shiyang Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 321 days.

(21) Appl. No.: 17/483,473

(22) Filed: Sep. 23, 2021

(65) Prior Publication Data

US 2022/0321122 A1 Oct. 6, 2022

Related U.S. Application Data

(63) Continuation of application No. PCT/CN2021/084259, filed on Mar. 31, 2021.

(51) Int. Cl.
*H03K 19/00* (2006.01)
*G11C 16/04* (2006.01)
(Continued)

(52) U.S. Cl.
CPC ..... *H03K 19/0005* (2013.01); *G11C 16/0483* (2013.01); *G11C 16/06* (2013.01); *G11C 29/50008* (2013.01)

(58) Field of Classification Search
CPC .......... H03K 19/0005; G11C 16/0483; G11C 16/06; G11C 16/20; G11C 16/32;
(Continued)

(56) References Cited

U.S. PATENT DOCUMENTS 11,152,939 B2 * 10/2021 Kang ............. H03K 19/018578
2009/0002018 A1 1/2009 Jeong et al.
(Continued)

FOREIGN PATENT DOCUMENTS

CN 106486155 A 3/2017
CN 108832915 A 11/2018
(Continued)

OTHER PUBLICATIONS

International Search Report issued in corresponding International Application No. PCT/CN2021/084259 dated Jan. 4, 2022, 5 pages.
(Continued)

*Primary Examiner* — Jung Kim
(74) *Attorney, Agent, or Firm* — BAYES PLLC

(57) ABSTRACT

In certain aspects, a circuit for ZQ resistor calibration can include a first input configured to receive a first default configuration. The circuit can also include a second input configured to receive a first calibration value based on a first comparison. The circuit can further include a first output configured to provide a first resistor code for a first resistor category. The circuit can additionally include a second output configured to provide a second resistor code for a second resistor category different from the first resistor category. The circuit can also include a first logic circuit configured to receive a signal from the first input and a signal from the second input, and provide a signal to the first output. The signal to the first output can include the first resistor code. The first resistor code can be different from the second resistor code.

20 Claims, 7 Drawing Sheets

(51) Int. Cl.
*G11C 16/06* (2006.01)
*G11C 29/50* (2006.01)

(58) Field of Classification Search
CPC ............... G11C 29/025; G11C 29/028; G11C 29/50008; G11C 13/0064; G11C 13/0069
See application file for complete search history.

(56) References Cited

U.S. PATENT DOCUMENTS

| | | |
|---|---|---|
| 2016/0179113 A1 | 6/2016 | Taigor et al. |
| 2016/0211031 A1 | 7/2016 | Taigor et al. |
| 2018/0114586 A1 | 4/2018 | Jang et al. |
| 2019/0080784 A1 | 3/2019 | Kim et al. |
| 2019/0198066 A1 | 6/2019 | Seong |
| 2019/0348096 A1 | 11/2019 | Antonyan et al. |

FOREIGN PATENT DOCUMENTS

| | | |
|---|---|---|
| CN | 112368772 A | 2/2021 |
| CN | 112562768 A | 3/2021 |
| CN | 109817258 A | 4/2021 |

OTHER PUBLICATIONS

Chinese Office action issued in corresponding Chinese Application No. 202180001099.5 dated Apr. 22, 2022, 8 pages.

\* cited by examiner

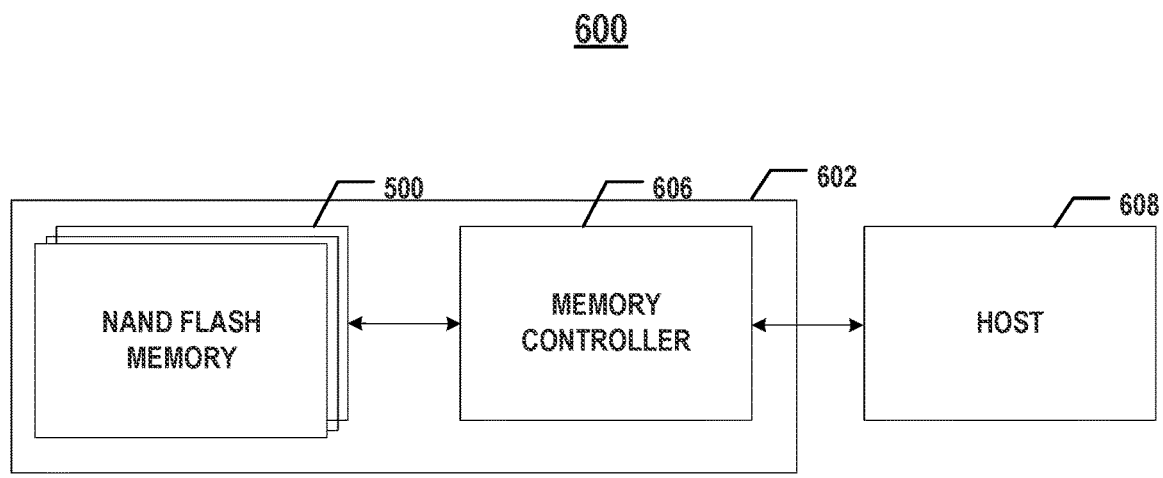
FIG. 6
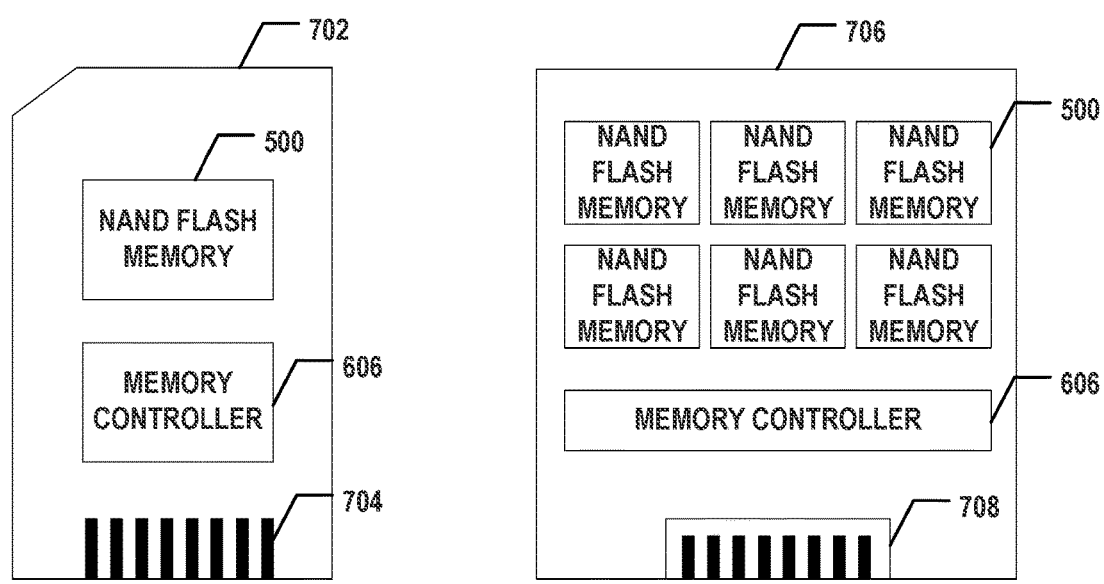
FIG. 7A
FIG. 7B

ZQ RESISTOR CALIBRATION CIRCUIT IN MEMORY DEVICE AND CALIBRATION METHOD THEREOF

CROSS-REFERENCE TO RELATED APPLICATIONS

This application is continuation of International Application No. PCT/CN2021/084259, filed on Mar. 31, 2021, entitled "ZQ RESISTOR CALIBRATION CIRCUIT IN MEMORY DEVICE AND CALIBRATION METHOD THEREOF," which is hereby incorporated by reference in its entirety.

BACKGROUND

The present disclosure relates to memory devices and calibration methods thereof.

Flash memory is a low-cost, high-density, non-volatile solid-state storage medium that can be electrically erased and reprogrammed. Flash memory includes NOR Flash memory or NAND Flash memory, named after the NOR and NAND logic gates.

NAND Flash memory can have its data bus operating with double data rate (DDR), transferring data on both the rising and falling edges of the block signal, also known as the toggle mode. Various versions of DDR standards, such as DDR2, DDR3, DDR4, etc., have been introduced to achieve higher bus speed and lower power.

SUMMARY

In one aspect, a circuit for ZQ resistor calibration can include a first input configured to receive a first default configuration. The circuit can also include a second input configured to receive a first calibration value based on a first comparison. The circuit can further include a first output configured to provide a first resistor code for a first resistor category. The circuit can additionally include a second output configured to provide a second resistor code for a second resistor category different from the first resistor category. The circuit can also include a first logic circuit configured to receive a signal from the first input and a signal from the second input, and provide a signal to the first output. The signal to the first output can include the first resistor code. The first resistor code can be different from the second resistor code.

In another aspect, a method of ZQ resistor calibration can include receiving, at a first input, a first default configuration. The method can also include receiving, at a second input, a first calibration value based on a first comparison. The method can further include providing, by a first output, a first resistor code for a first resistor category. The method can additionally include providing, by a second output, a second resistor code for a second resistor category different from the first resistor category, wherein the first resistor code is different from the second resistor code. The method can also include generating, by a first logic circuit, the first resistor code based on the first default configuration or the first calibration value.

In still another aspect, a memory device can include a NAND memory array and a peripheral circuit. The peripheral circuit is coupled to the NAND memory array and comprises a circuit for ZQ resistor calibration. The circuit for ZQ resistor calibration can include a first input configured to receive a first default configuration. The circuit can also include a second input configured to receive a first calibration value based on a first comparison. The circuit can further include a first output configured to provide a first resistor code for a first resistor category. The circuit can additionally include a second output configured to provide a second resistor code for a second resistor category different from the first resistor category. The circuit can also include a first logic circuit configured to receive a signal from the first input and a signal from the second input, and provide a signal to the first output. The signal to the first output can include the first resistor code. The first resistor code can be different from the second resistor code.

In yet another aspect, a memory system can include a memory device configured to store data. The memory device can include a NAND memory array. The memory device can also include a peripheral circuit coupled to the NAND memory array and comprising a circuit for ZQ resistor calibration. The circuit for ZQ resistor calibration can include a first input configured to receive a first default configuration. The circuit for ZQ resistor calibration can also include a second input configured to receive a first calibration value based on a first comparison. The circuit for ZQ resistor calibration can additionally include a first output configured to provide a first resistor code for a first resistor category. The circuit for ZQ resistor calibration can also include a second output configured to provide a second resistor code for a second resistor category different from the first resistor category. The circuit for ZQ resistor calibration can further include a first logic circuit configured to receive a signal from the first input and a signal from the second input. and provide a signal to the first output. The signal to the first output can be the first resistor code. The first resistor code can be different from the second resistor code. The memory system can also include a memory controller coupled to the memory device and configured to control the memory device.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 6 illustrates a block diagram of an exemplary system having a memory device, according to some aspects of the present disclosure.

FIG. 7A illustrates a diagram of an exemplary memory card having a memory device, according to some aspects of the present disclosure.

FIG. 7B illustrates a diagram of an exemplary solid-state drive (SSD) having a memory device, according to some aspects of the present disclosure.

Figure 1:
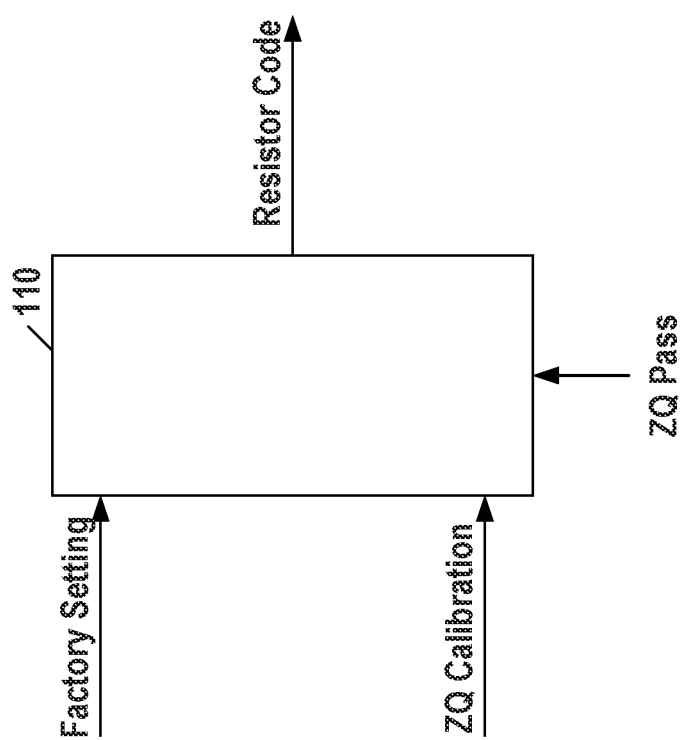
FIG. 1 illustrates a logic code generator.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Data pins in a bidirectional bus may be labeled as DQ, and the data strobe pin may be labeled as DQS. With input/output (IO) speed increases, NAND Flash memory is adopting the low-power double data rate four (LPDDR4) IO standard to reduce the power consumption in DQ/DQS output buffers. During the transition period from double data rate three (DDR3) to LPDDR4 standard, a NAND Flash memory device including its ZQ calibration circuit may need to be backward compatible with old DDR3 controllers. ZQ calibration changes the values of on-chip pull-up and pull-down resistors connected to the Vccq/2 pins (a.k.a. ZQ pins).

FIG. 1 illustrates a logic code generator 110. Logic code generator 110 can be configured to provide a resistor code as an output. The resistor code may be controlled either by a factory setting or by ZQ calibration. A ZQ pass input can control the logic code generator 110 to select between the factory setting or ZQ calibration. The logic code generator 110 may be implemented in hardware, such as integrated circuits (e.g., application-specific integrated circuits (ASICs)), or may be implemented by a processor (e.g., a microcontroller unit (MCU)) controlled by software and/or firmware.

ZQ calibration can be used to calibrate NAND Ron and Rtt values. After ZQ, the Rtt/target shift may be much higher than the Ron/target shift. This intrinsic mismatch may be due to the different definitions of Ron and Rtt. In approaches shown in FIG. 1, the use of a single resistor code for both Ron and Rtt may suffer from a problem of compromise. For example, if the resistor code is a good choice for Ron values, then it may be a less good choice for Rtt values. Similarly, if the resistor code is a good choice for Rtt values, then it may be a less good choice for Ron values. The difference between Ron and Rtt values may depend on the particular memory circuits and even may vary from one batch to another batch. Nevertheless, while pull-up and pull-down Ron values may be similar to one another, Rtt values may be, for example, 20% different from the Ron values.

Figure 2:
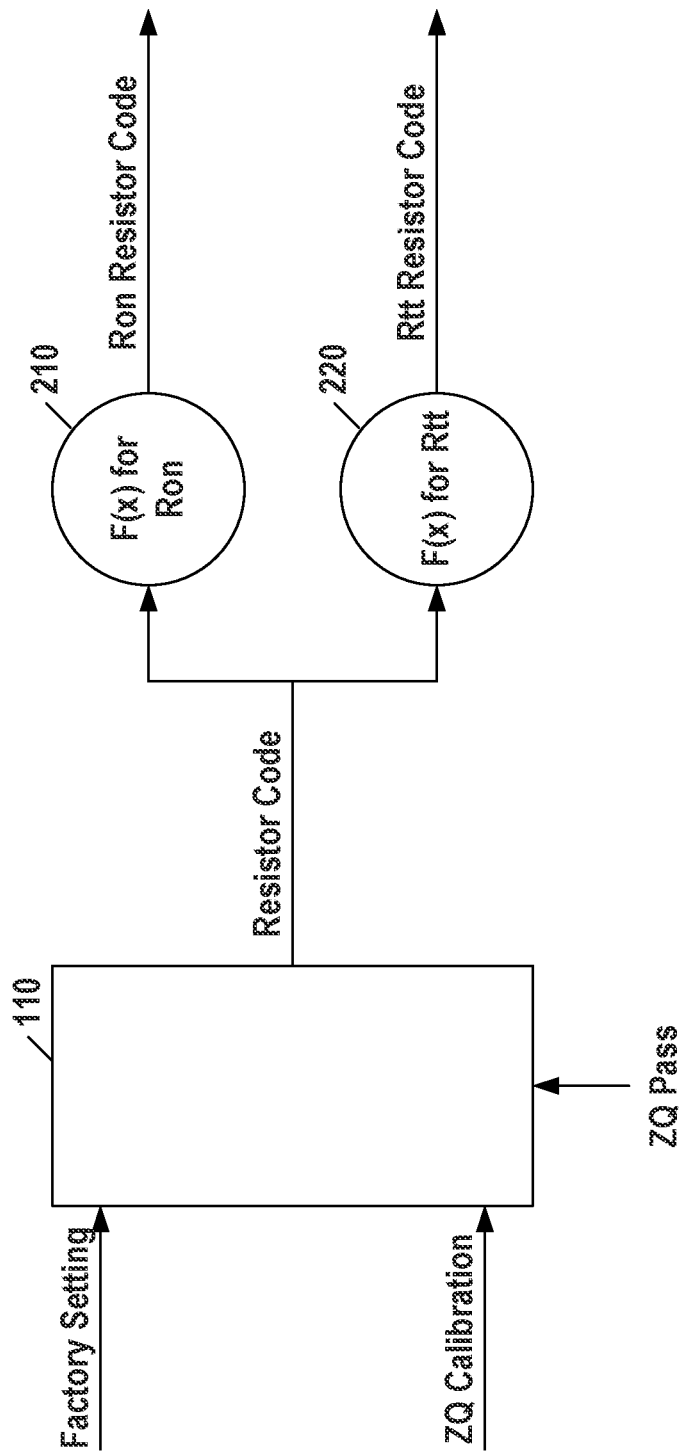
FIG. 2 illustrates an exemplary logic code generator with post-adjustment function circuits, according to some aspects of the present disclosure.

FIG. 2 illustrates an exemplary logic code generator 110 with post-adjustment function circuits 210 and 220, according to some aspects of the present disclosure. In the approach of FIG. 2, a first resistor code (for example, an Ron resistor code) and a second resistor code (for example, an Rtt resistor code) can be generated using post-adjustment function circuits 210 and 220 from a single intermediate resistor code provided by logic code generator 110. Logic code generator 110 may take an analog or digital input and generate a coded output. The coded output may be a binary code, for example, a bitmap or other indication of transistors to be enabled and/or disabled to achieve a desired value.

The approach of FIG. 2 permits a single input ZQ calibration value to be used to generate two different resistor codes, which can be tailored for different types of resistors. In this way, the circuit may provide greater accuracy in values for the different types of resistors, while minimizing circuitry involved. Although only two different resistor code types are shown, more than two different resistor codes can be generated in the same way.

Figure 3:
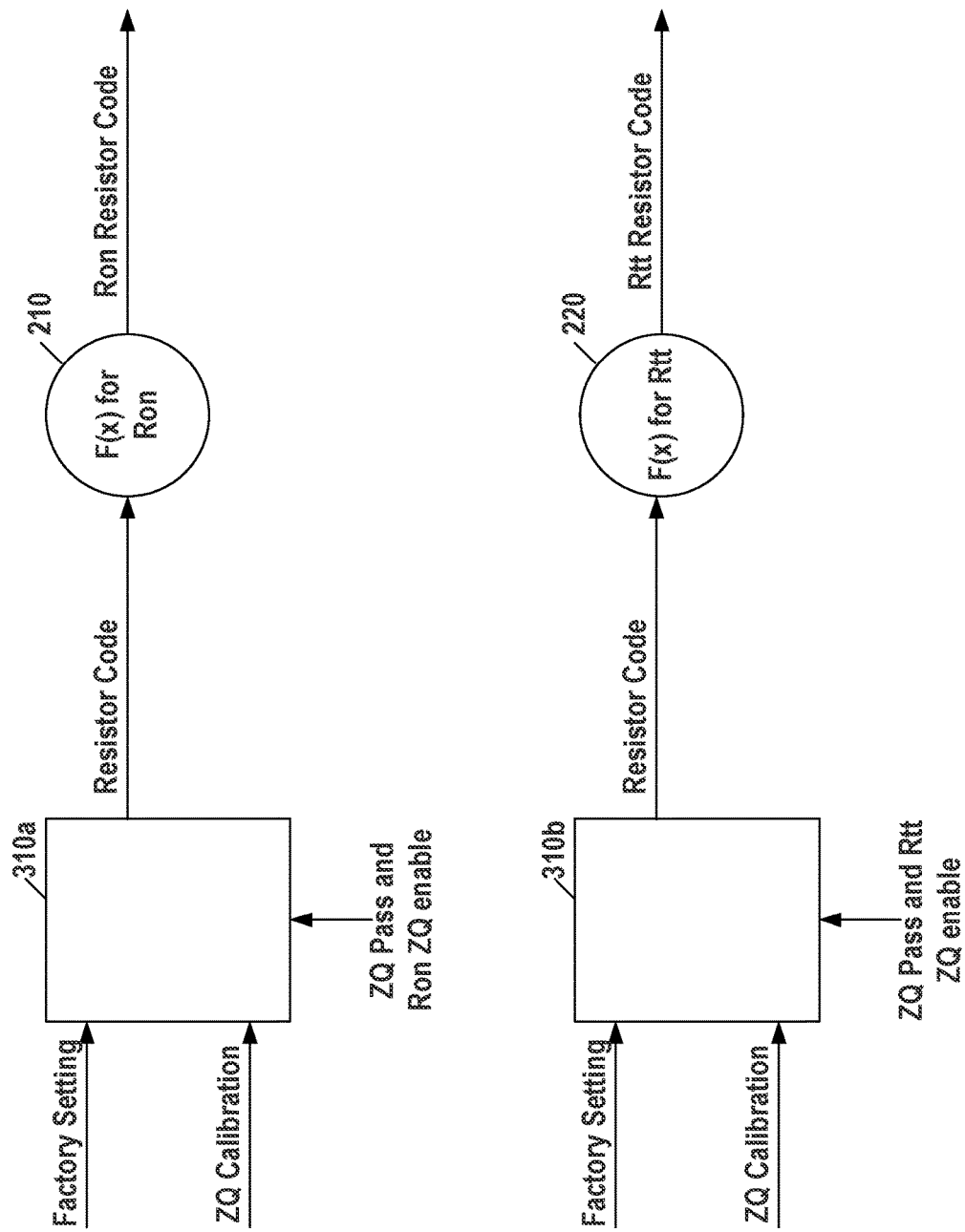
FIG. 3 illustrates exemplary separate logic code generators with post-adjustment function circuits, according to some aspects of the present disclosure.

FIG. 3 illustrates exemplary separate logic code generators 310a and 310b with post-adjustment function circuits 210 and 220, according to some aspects of the present disclosure. The approach of FIG. 3 differs from the approach of FIG. 2 in that there are separate logic code generators 310a and 310b that each can generate an intermediate resistor code (for example, a third resistor code and a fourth resistor code) from which the post-adjustment function circuits 210 and 220 can generate the first and second resistor codes, respectively.

As with the example in FIG. 2, in FIG. 3 although only two different resistor code types are shown, more than two different resistor codes can be generated in the same way. In certain embodiments, the post-adjustment function circuits 210 and 220 may be omitted or may be disabled, such that they simply pass through the resistor code generated by the corresponding logic code generators 310a or 310b.

Some aspects of the present disclosure provide a Ron and Rtt calibration method based on ZQ calibration. Moreover, some aspects of the present disclosure provide a post adjustment function to tune Ron and Rtt resistor code(s). These are illustrated, by way of example, as post-adjustment function circuits 210 and 220 in FIGS. 2 and 3. Also, some implementations provide separated Ron and Rtt resistor code generation. This is illustrated as partially separated in FIG. 2 and as fully separated in FIG. 3, as two examples. Some implementations also provide a separated ZQ calibration enable method for Ron and Rtt, as shown in FIG. 3.

The post-adjustment function circuits 210 and 220 may be configured by firmware, while the logic code generator 110 and logic code generators 310a and 310b may be configured in hardware. For example, the factory setting may be provided from firmware or hardware. The logic code generator 110 and logic code generators 310a and 310b may be manufactured according to an expectation of the characteristics of the memory. Firmware for the post-adjustment function circuits 210 and 220 may be controlled based on measured values after tape-out, for example, after testing is performed on a prototype. Alternatively, the post-adjustment function circuits 210 and 220 may be completely hardware. In the case of firmware control of post-adjustment function circuits 210 and 220, the firmware controlling the post-adjustment function circuits 210 and 220 may be viewed as providing a software/firmware patch to the operation of logic code generator 110 and logic code generators 310a and 310b. The process of modifying the post-adjustment function with firmware or software can be described as trimming the post-adjustment function.

Rtt can be an output resistor for use in the output of data from a memory, while Ron can be an input resistor for use in the input of data to the memory. The resistor code may be a binary number that may indicate which transistor(s) of a set of transistors to activate or inactivate to yield the desired resistance. For example, multiple p-type metal-oxide-semiconductor (PMOS) transistors may be available, and the resistor code may indicate which PMOS transistors to enable to achieve a desired value. For example, a code of [0,1,0] may enable only a second PMOS transistor, whereas a code of [1,0,1] may enable a first PMOS transistor and a third PMOS transistor, but not the second PMOS transistor. The post-adjustment function circuits 210 and 220 may take an intermediate resistor code and perform an add, subtract, or shift operation on the intermediate resistor code to provide the first and second resistor codes. N-type metal-oxide-semiconductor (NMOS) transistors can similarly be used, and PMOS and NMOS transistors are just examples and do not limit other types of transistors.

The logic code generator 110 in FIG. 2 and the logic code generators 310a and 310b may be implemented in hardware, such as integrated circuits (e.g., application-specific integrated circuits (ASICs)), or may be implemented by a processor (e.g., a microcontroller unit (MCU)) controlled by software and/or firmware.

Figure 4:
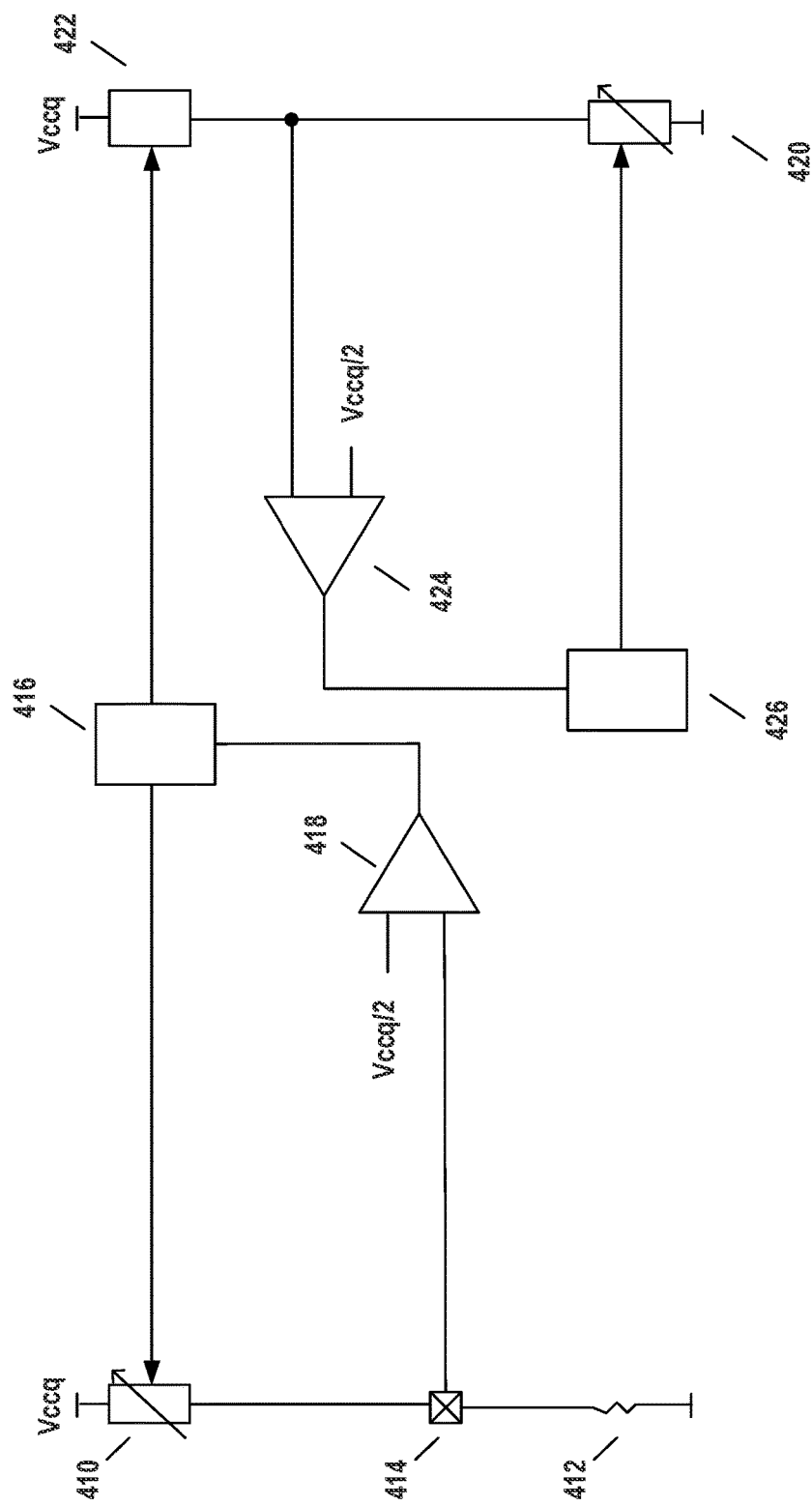
FIG. 4 illustrates double data rate 3 (DDR3) two-step calibration.

FIG. 4 illustrates double data rate 3 (DDR3) two-step calibration. A DDR3-type ZQ circuit in a NAND flash memory can adopt a two-step calibration. In the first step, a pull-up driver 410 can be calibrated against an external reference resistor 412 applied to a resistor input 414. Pull-up driver 410 is shown as being calibrated to 300Ω, in that external reference resistor 412 is a 300Ω resistor in this example. The calibration can be performed by a logic pull-up code generator 416 based on a comparison made with a first comparator 418. In the second step, a pull-down driver 420 can be calibrated against a replica 422 of pull-up driver 410 calibrated in the first step. Both pull-down driver 420 and replica 422 are shown as calibrated to 300Ω. The calibration can be performed by a logic pull-up code generator 426 based on a comparison made with a second comparator 424. The reference voltage of the calibration for each of first comparator 418 and second comparator 424 can be half of the supply voltage, namely Vccq/2.

The example of FIG. 4 provides two examples (pull-down driver 420 and pull-up driver 410) of how a logic code generator can be used in connection with various pull-up and pull-down drivers. This example is not limiting, but merely provides a context. For example, the output of first comparator 418 may serve as a ZQ calibration input to a logic code generator. Similarly, the output of second comparator 424 may serve as a ZQ calibration input to another logic code generator. In this case, because pull-up driver 410 is a pull-up driver, while pull-down driver 420 is a pull-down driver, they may use different logic code generators. On the other hand, replica 422 may use a same resistor code as pull-up driver 410.

Figure 5:
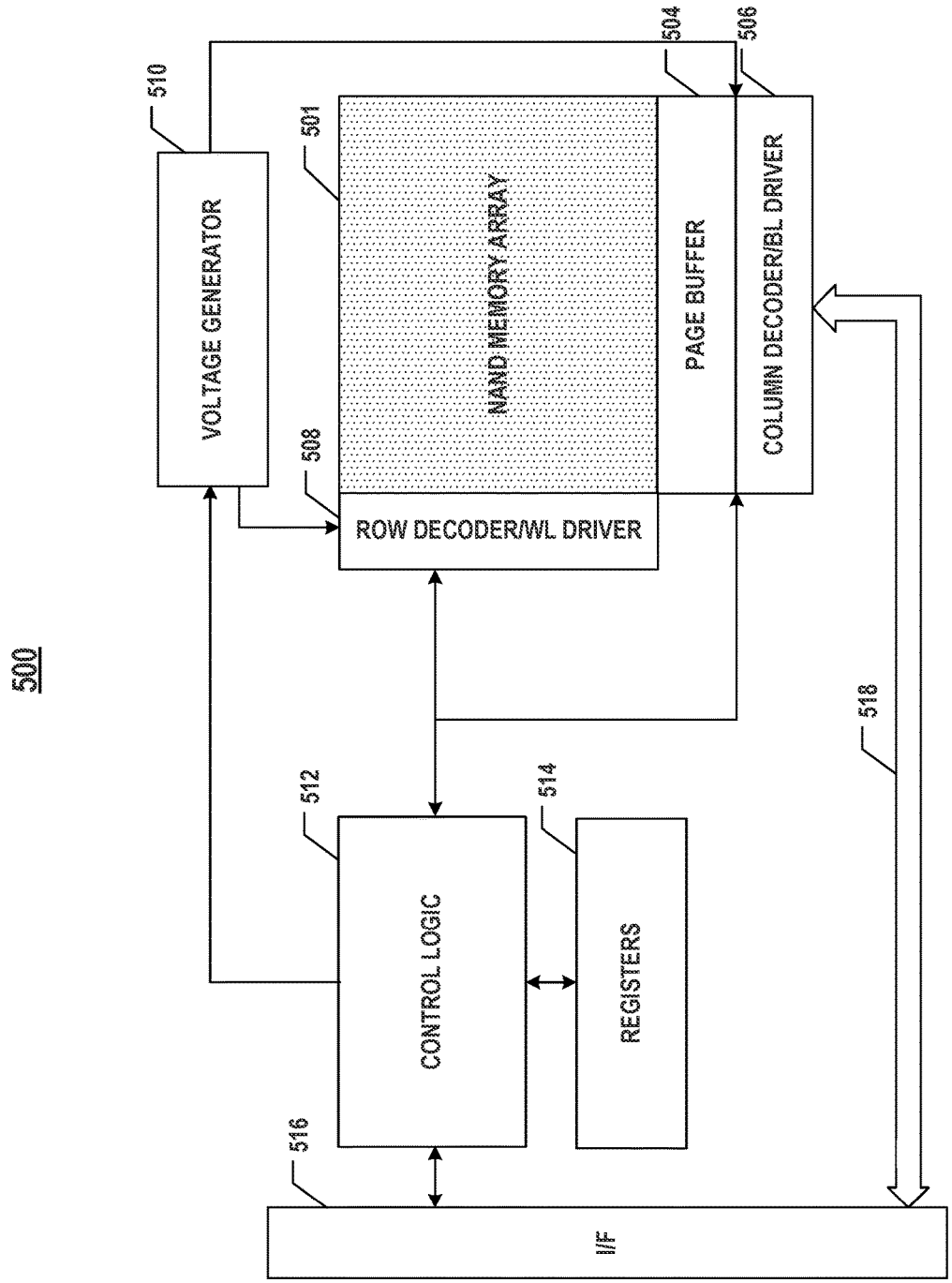
FIG. 5 illustrates an exemplary NAND Flash memory device, according to some aspects of the present disclosure.

FIG. 5 illustrates an exemplary NAND Flash memory device 500, according to some aspects of the present disclosure. The NAND Flash memory 500 may be or include a three-dimensional (3D) NAND memory device. As shown in FIG. 5, NAND Flash memory 500 can include a NAND memory array 501 including an array of NAND memory cells in the form of NAND memory strings. NAND Flash memory 500 can also include peripheral circuits configured to facilitate the operations of NAND memory cells, such as read, program, and erase. The peripheral circuits can include, for example, a page buffer 504, a column decoder/bit line driver 506, a row decoder/word line driver 508, a voltage generator 510, control logic 512, registers 514, an interface 516, and a data bus 518. It is understood that in some examples, additional peripheral circuits may be included as well. A ZQ resistor calibration circuit can be implemented in any suitable components of NAND Flash memory 500, such as interface 516 and/or data bus 518.

Page buffer 504 can be configured to read and program data from and to NAND memory array 501 according to the control of control logic 512. In one example, page buffer 504 may store one page of program data (write data) to be programmed into one page of NAND memory array 501. In another example, page buffer 504 also performs program verify operations to ensure that the data has been properly programmed into memory cells coupled to selected word lines. Row decoder/word line driver 508 can be configured to be controlled by control logic 512 and select a block of NAND memory array 501 and a word line of the selected block. Row decoder/word line driver 508 can be further configured to drive the selected word line using a word line voltage generated from voltage generator 510. Voltage generator 510 can be configured to be controlled by control logic 512 and generate the word line voltages (e.g., read voltage, program voltage, pass voltage, local voltage, and verification voltage) to be supplied to NAND memory array 501. Column decoder/bit line driver 506 can be configured to be controlled by control logic 512 and select one or more NAND memory strings by applying bit line voltages generated from voltage generator 510. For example, column decoder/bit line driver 506 may apply column signals for selecting a set of N bits of data from page buffer 504 to be outputted in a read operation.

Control logic 512 can be coupled to each peripheral circuit and configured to control operations of peripheral circuits. Registers 514 can be coupled to control logic 512 and include status registers, command registers, and address registers for storing status information, command operation codes (OP codes), and command addresses for controlling the operations of each peripheral circuit.

Interface 516 can be coupled to control logic 512 and act as a control buffer to buffer and relay control commands received from a host (not shown) to control logic 512 and status information received from control logic 512 to the host. Interface 516 can also be coupled to page buffer 504 via column decoder/bit line driver 506 and act as an IO interface and a data buffer to buffer and relay the program data received from a host (not shown) to page buffer 504 and the read data from page buffer 504 to the host. As shown in FIG. 5, bidirectional data bus 518 can connect interface 516 and column decoder/bit line driver 506 for transferring data to and from NAND memory array 501. The multi-mode calibration circuit disclosed herein (e.g., in FIG. 4) may provide calibration to pull-up drivers and pull-down drivers associated with data bus 518 and/or interface 516. The multi-mode calibration circuit may also be used to calibrate other drivers, with these use cases being provided by way of example and illustration and not by way of limitation.

FIG. 6 illustrates a block diagram of an exemplary system 600 having a memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more NAND Flash memory 500 and a memory controller 606. Host 608 can be a processor of an electronic device, such as a central processing unit (CPU), or a system-on-chip (SoC), such as an application processor (AP). Host 608 can be configured to send or receive the data to or from NAND Flash memory 500.

NAND Flash memory 500, as described above, can include a ZQ resistor calibration circuit. The ZQ calibration circuit disclosed herein can be implemented for any suitable components of the peripheral circuits of NAND Flash memory 500, such as interface 516 and/or data bus 518.

Memory controller 606 is coupled to NAND Flash memory 500 and host 608 and is configured to control NAND Flash memory 500, according to some implementations. Memory controller 606 can manage the data stored in NAND Flash memory 500 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 606 can be configured to control operations of NAND Flash memory 500, such as read, erase, and program operations. Memory controller 606 can also be configured to manage various functions with respect to the data stored or to be stored in NAND Flash memory 500 including, but not limited to bad-block management, garbage collection, logical-to-physical address conversion, wear leveling, etc. In some implementations, memory controller 606 is further configured to process error correction codes (ECCs) with respect to the data read from or written to NAND Flash memory 500. Any other suitable functions may be performed by memory controller 606 as well, for example, formatting NAND Flash memory 500. Memory controller 606 can communicate with an external device (e.g., host 608) according to a particular communication protocol. For example, memory controller 606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 606 and one or more NAND Flash memory 500 can be integrated into various types of storage devices, for example, be included in the same package, such as a universal Flash storage (UFS) package or an eMMC package. That is, memory system 602 can be implemented and packaged into different types of end electronic products. In one example as shown in FIG. 7A, memory controller 606 and a single NAND Flash memory 500 may be integrated into a memory card 702. Memory card 702 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 702 can further include a memory card connector 704 coupling memory card 702 with a host (e.g., host 608 in FIG. 6). In another example as shown in FIG. 7B, memory controller 606 and multiple NAND Flash memory 500 may be integrated into an SSD 706. SSD 706 can further include an SSD connector 708 coupling SSD 706 with a host (e.g., host 608 in FIG. 6). In some implementations, the storage capacity and/or the operation speed of SSD 706 is greater than those of memory card 702.

Figure 8:
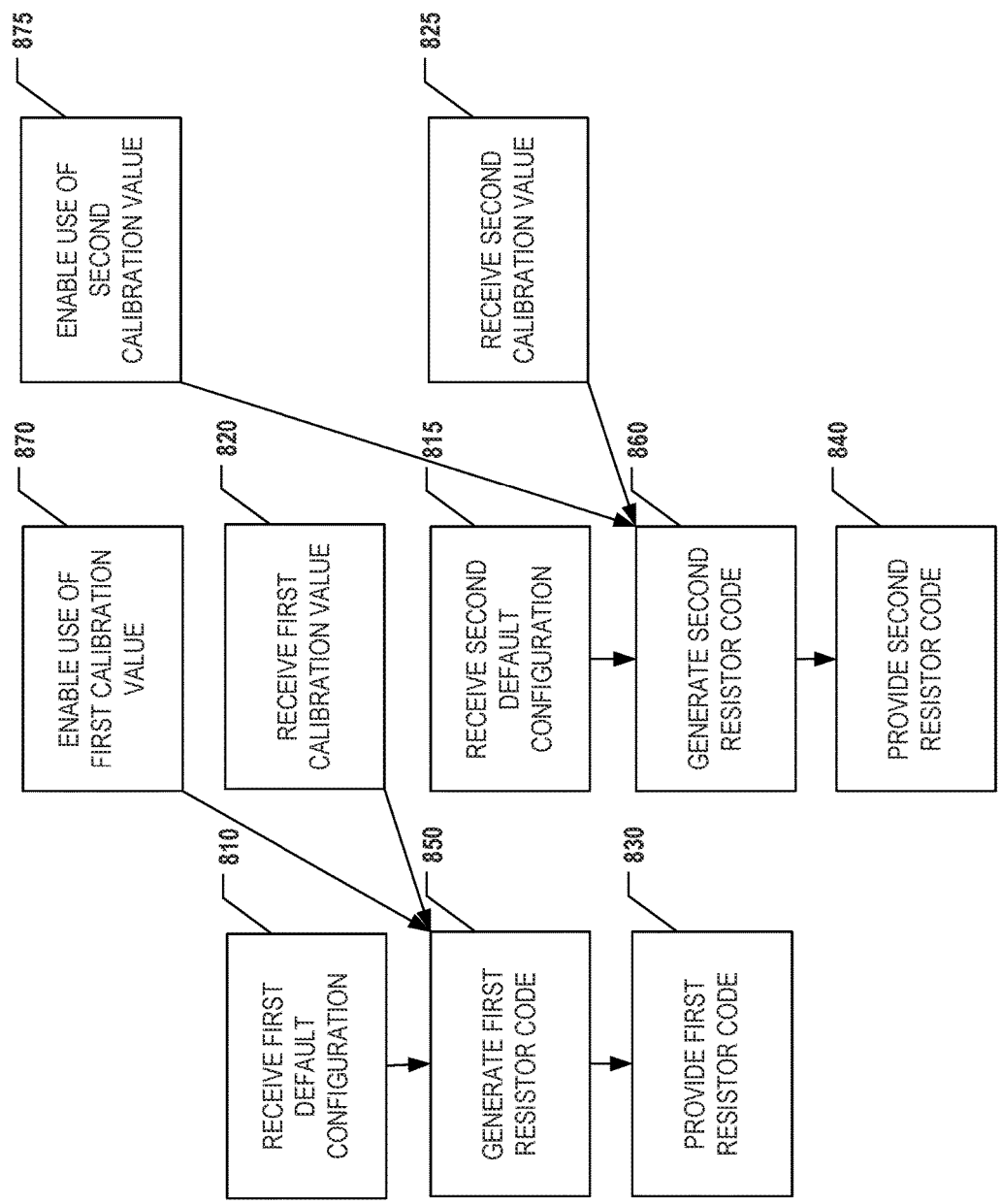
FIG. 8 illustrates a flow chart of an exemplary calibration method, according to some aspects of the present disclosure.

FIG. 8 illustrates a flow chart of an exemplary calibration method according to some aspects of the present disclosure. The method may be implemented by, for example, the circuit of FIG. 2 or FIG. 3, or the like. The method of ZQ resistor calibration can include, at 810, receiving, at a first input, a first default configuration. This default configuration may be the factory setting shown in FIG. 2 or the upper factory setting shown in FIG. 3.

The method can also include, at 820, receiving, at a second input, a first calibration value based on a first comparison. The first calibration value may be the ZQ calibration shown in FIG. 2 or the upper of the two ZQ calibrations shown in FIG. 3. The first comparison may be a comparison between the resistance of a driver of interest and an external resistor or other comparison sources, as illustrated by way of example in FIG. 4.

The method can further include, at 830, providing, by a first output, a first resistor code for a first resistor category. This may be the Ron resistor code in FIGS. 2 and 3. The method can additionally include, at 840, providing, by a second output, a second resistor code for a second resistor category different from the first resistor category. The first resistor code can be different from the second resistor code. This second resistor code can be the Rtt resistor code shown in FIGS. 2 and 3.

The method can additionally include, at 850, generating, by a first logic circuit, the first resistor code based on the first default configuration or the first calibration value. For example, in FIGS. 2 and 3, the Ron resistor code can be based on the factory setting or ZQ calibration as processed in logic code generator 110 and post-adjustment function circuit 210.

The method can also include, at 860, generating, by the first logic circuit, a signal to the second output, wherein the signal to the second output comprises the second resistor code. In this case, the first logic circuit can be the logic code generator 110 and post-adjustment function circuit 210, as shown in FIG. 2.

The generating the first resistor code and the generating the second resistor code can include generating, by a main logic circuit (for example, logic code generator 110 in FIG. 2), a third resistor code and generating, by a first post-adjustment circuit (for example, post-adjustment function circuit 210 in FIG. 2), the first resistor code from the third resistor code as well as generating, by a second post-adjustment circuit (for example, post-adjustment function circuit 220 in FIG. 2), the second resistor code from the third resistor code.

As another alternative, as illustrated in FIG. 3, the generating the second resistor code can involve generating, by a second logic circuit (for example, logic code generator 310b in FIG. 3), the second resistor code, wherein the second logic circuit is distinct from the first logic circuit (for example, logic code generator 310a in FIG. 3).

The generating, by the second logic circuit, can include at 815 receiving, at a third input, a second default configuration. The second default configuration can be the lower factory setting in FIG. 3. The generating can further include, at 825, receiving, at a fourth input, a second calibration value based on a second comparison. The second comparison may similarly be a comparison made using a comparator illustrated, by way of example, in FIG. 4. The second calibration may be the ZQ calibration illustrated in the lower portion of FIG. 3. The second resistor code can be based on one of the second default configurations or the second calibration value. For example, the Rtt resistor code can be either based on the factory setting or the ZQ calibration.

The generating the first resistor code can include generating, by a first main logic circuit (for example, logic code generator 310a in FIG. 3), a third resistor code. The generating can further include generating, by a first post-adjustment circuit (for example, post-adjustment function circuit 210 in FIG. 2), the first resistor code from the third resistor code.

The generating the second resistor code can include generating, by a second main logic circuit (for example, logic code generator 310b in FIG. 3), a fourth resistor code, and generating, by a second post-adjustment circuit (for example, post-adjustment function circuit 220 in FIG. 2), the second resistor code from the fourth resistor code.

Thus, in these above examples, the third resistor code and fourth resistor code can refer to intermediate resistor codes generated by the main logic circuit prior to the post-adjustment function.

The method shown in FIG. 8 can also include, at 870, enabling, by a fifth input, the use of the first calibration value. The method can further include, at 875, enabling, by a sixth input, the use of the second calibration value. This enabling can be performed with the ZQ pass and Ron ZQ enable in FIG. 3 and the ZQ pass and Rtt ZQ enable in FIG. 3. The first resistor code can be based on the first default configuration when the use of the first calibration value is not enabled, and the second resistor code can be based on the second default configuration when the use of the second calibration value is not enabled. The fifth input can be independent of the sixth input. Thus, in certain cases, the Ron ZQ enable may be on, whereas the Rtt ZQ enable may be off, or vice versa. Alternatively, they may both be on, or both be off.

The first post-adjustment circuit can operate by adding, subtracting, or shifting using a first digital circuit to generate the first resistor code from an intermediate resistor code, such as the third resistor code. Similarly, the second post-adjustment circuit can operate by adding, subtracting, or shifting using a second digital circuit to generate the second resistor code from an intermediate resistor code, such as the third resistor code (in FIG. 2) or the fourth resistor code (in FIG. 3). The first resistor category in the above example may be Ron, while the second resistor category may be Rtt.

According to one aspect of the present disclosure, a circuit for ZQ resistor calibration can include a first input configured to receive a first default configuration. The circuit can also include a second input configured to receive a first calibration value based on a first comparison. The circuit can further include a first output configured to provide a first resistor code for a first resistor category. The circuit can additionally include a second output configured to provide a second resistor code for a second resistor category different from the first resistor category. The circuit can also include a first logic circuit configured to receive a signal from the first input and a signal from the second input, and provide a signal to the first output. The signal to the first output can include the first resistor code. The first resistor code can be different from the second resistor code.

In some implementations, the first logic circuit can be further configured to provide a signal to the second output. The signal to the second output can be the second resistor code.

In some implementations, the first logic circuit can include a main logic circuit configured to provide a third resistor code. The first logic circuit can also include a first post-adjustment circuit configured to convert the third resistor code into the first resistor code. The first logic circuit can further include a second post-adjustment circuit configured to convert the third resistor code into the second resistor code.

In some implementations, the circuit can further include a second logic circuit configured to provide a signal to the second output. The signal to the second output can be the second resistor code. The second logic circuit can be distinct from the first logic circuit.

In some implementations, the circuit can further include a third input configured to receive a second default configuration. The circuit can additionally include a fourth input configured to receive a second calibration value based on a second comparison. The second logic circuit can be configured to receive a signal from the third input and to receive a signal from the fourth input.

In some implementations, the first logic circuit can include a first main logic circuit configured to provide a third resistor code. The first logic circuit can also include a first post-adjustment circuit configured to convert the third resistor code into the first resistor code.

In some implementations, the second logic circuit can also include a second main logic circuit configured to provide a fourth resistor code. The second logic circuit can further include a second post-adjustment circuit configured to convert the fourth resistor code into the second resistor code.

In some implementations, the circuit can further include a fifth input configured to enable use of the first calibration value. The circuit can additionally include a sixth input configured to enable use of the second calibration value. The first resistor code can be based on the first default configuration when the use of the first calibration value is not enabled. The second resistor code can be based on the second default configuration when the use of the second calibration value is not enabled.

In some implementations, the fifth input can be independent of the sixth input.

In some implementations, the first post-adjustment circuit can include a first digital circuit configured to perform at least one of add, subtract, or shift.

In some implementations, the second post-adjustment circuit can include a second digital circuit configured to perform at least one of add, subtract, or shift.

In some implementations, the first resistor category can be Ron which is an input resistor for use in the input of data to a memory.

In some implementations, the second resistor category can be Rtt which is an output resistor for use in the output of data from a memory.

According to another aspect of the present disclosure, a method of ZQ resistor calibration can include receiving, at a first input, a first default configuration. The method can also include receiving, at a second input, a first calibration value based on a first comparison. The method can further include providing, by a first output, a first resistor code for a first resistor category. The method can additionally include providing, by a second output, a second resistor code for a second resistor category different from the first resistor category, wherein the first resistor code is different from the second resistor code. The method can also include generating, by a first logic circuit, the first resistor code based on the first default configuration or the first calibration value.

In some implementations, the method can further include generating, by the first logic circuit, a signal to the second output, wherein the signal to the second output comprises the second resistor code.

In some implementations, generating the first resistor code and the generating the second resistor code can include generating, by a main logic circuit, a third resistor code, generating, by a first post-adjustment circuit, the first resistor code from the third resistor code, and generating, by a second post-adjustment circuit, the second resistor code from the third resistor code.

In some implementations, the method can further include generating, by a second logic circuit, the second resistor code, wherein the second logic circuit is distinct from the first logic circuit.

In some implementations, the generating, by the second logic circuit can include receiving, at a third input, a second default configuration, and receiving, at a fourth input, a second calibration value based on a second comparison. The second resistor code can be based on one of the second default configurations or the second calibration value.

In some implementations, the generating the first resistor code can include generating, by a first main logic circuit, a third resistor code. The generating the first resistor code can also include generating, by a first post-adjustment circuit, the first resistor code from the third resistor code.

In some implementations, the generating the second resistor code can include generating, by a second main logic circuit, a fourth resistor code and generating, by a second post-adjustment circuit, the second resistor code from the fourth resistor code.

In some implementations, the method can further include enabling, by a fifth input, use of the first calibration value. The method can additionally include enabling, by a sixth input, use of the second calibration value. The first resistor code can be based on the first default configuration when the use of the first calibration value is not enabled. The second resistor code can be based the second default configuration when the use of the second calibration value is not enabled.

In some implementations, the fifth input can be independent of the sixth input.

In some implementations, the method can further include adding, subtracting, or shifting, by the first post-adjustment circuit using a first digital circuit, to generate the first resistor code.

In some implementations, the method can further include adding, subtracting, or shifting, by the second post-adjustment circuit using a second digital circuit, to generate the second resistor code.

In some implementations, the first resistor category can be Ron which is an input resistor for use in the input of data to a memory.

In some implementations, the second resistor category can be Rtt which is an output resistor for use in the output of data from a memory.

According to a further aspect of the present disclosure, a memory system can include a memory device configured to store data. The memory device can include a NAND memory array. The memory device can also include a peripheral circuit coupled to the NAND memory array and comprising a circuit for ZQ resistor calibration. The circuit for ZQ resistor calibration can include a first input configured to receive a first default configuration. The circuit for ZQ resistor calibration can also include a second input configured to receive a first calibration value based on a first comparison. The circuit for ZQ resistor calibration can additionally include a first output configured to provide a first resistor code for a first resistor category. The circuit for ZQ resistor calibration can also include a second output configured to provide a second resistor code for a second resistor category different from the first resistor category. The circuit for ZQ resistor calibration can further include a first logic circuit configured to receive a signal from the first input and a signal from the second input, and provide a signal to the first output. The signal to the first output can be the first resistor code. The first resistor code can be different from the second resistor code. The memory system can also include a memory controller coupled to the memory device and configured to control the memory device.

In some implementations, the memory system can further include a host coupled to the memory controller and configured to send or receive the data.

In some implementations, the memory device can be a three-dimensional (3D) NAND memory device.

According to a further aspect of the present disclosure, a memory device can include a NAND memory array and a peripheral circuit. The peripheral circuit is coupled to the NAND memory array and comprises a circuit for ZQ resistor calibration. The circuit for ZQ resistor calibration can include a first input configured to receive a first default configuration. The circuit can also include a second input configured to receive a first calibration value based on a first comparison. The circuit can further include a first output configured to provide a first resistor code for a first resistor category. The circuit can additionally include a second output configured to provide a second resistor code for a second resistor category different from the first resistor category. The circuit can also include a first logic circuit configured to receive a signal from the first input and a signal from the second input, and provide a signal to the first output. The signal to the first output can include the first resistor code. The first resistor code can be different from the second resistor code.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A circuit for ZQ resistor calibration, comprising:
   a first input configured to:
      receive a first default configuration;
   a second input configured to:
      receive a first calibration value based on a first comparison;
   a first output configured to:
      provide a first resistor code for a first resistor category;
   a second output configured to:
      provide a second resistor code for a second resistor category different from the first resistor category; and
   a first logic circuit configured to:
      receive a signal from the first input and a signal from the second input; and
      provide a signal to the first output, wherein the signal to the first output comprises the first resistor code,
wherein the first resistor code is different from the second resistor code, and
wherein the first calibration value includes a single calibration value used to generate the first resistor code and the second resistor code.

2. The circuit of claim 1, wherein the first logic circuit is further configured to:
provide a signal to the second output, the signal to the second output comprising the second resistor code.

3. The circuit of claim 2, wherein the first logic circuit comprises:
a main logic circuit configured to:
provide a third resistor code;
a first post-adjustment circuit configured to:
convert the third resistor code into the first resistor code; and
a second post-adjustment circuit configured to:
convert the third resistor code into the second resistor code.

4. The circuit of claim 1, further comprising:
a second logic circuit configured to:
provide a signal to the second output, the signal to the second output comprising the second resistor code, and the second logic circuit being distinct from the first logic circuit.

5. The circuit of claim 4, further comprising:
a third input configured to:
receive a second default configuration; and
a fourth input configured to:
receive a second calibration value based on a second comparison,
wherein the second logic circuit is configured to receive a signal from the third input and to receive a signal from the fourth input.

6. The circuit of claim 4, wherein the first logic circuit comprises:
a first main logic circuit configured to:
provide a third resistor code; and
a first post-adjustment circuit configured to:
convert the third resistor code into the first resistor code.

7. The circuit of claim 4, wherein the second logic circuit comprises:
a second main logic circuit configured to:
provide a fourth resistor code; and
a second post-adjustment circuit configured to:
convert the fourth resistor code into the second resistor code.

8. The circuit of claim 5, further comprising:
a fifth input configured to:
enable use of the first calibration value; and
a sixth input configured to:
enable use of the second calibration value,
wherein the first resistor code is based on the first default configuration when the use of the first calibration value is not enabled, and
wherein the second resistor code is based on the second default configuration when the use of the second calibration value is not enabled.

9. The circuit of claim 8, wherein the fifth input is independent of the sixth input.

10. The circuit of claim 3, wherein the first post-adjustment circuit comprises a first digital circuit configured to:
perform at least one of add, subtract, or shift.

11. The circuit of claim 3, wherein the second post-adjustment circuit comprises a second digital circuit configured to:
perform at least one of add, subtract, or shift.

12. The circuit of claim 1, wherein the first resistor category comprises Ron which is an input resistor for use in an input of data to a memory.

13. The circuit of claim 1, wherein the second resistor category comprises Rtt which is an output resistor for use in an output of data from a memory.

14. A method of ZQ resistor calibration, comprising:
receiving, at a first input, a first default configuration;
receiving, at a second input, a first calibration value based on a first comparison;
providing, by a first output, a first resistor code for a first resistor category;
providing, by a second output, a second resistor code for a second resistor category different from the first resistor category, the first resistor code being different from the second resistor code; and
generating, by a first logic circuit, the first resistor code based on the first default configuration or the first calibration value,
wherein the first calibration value includes a single calibration value used to generate the first resistor code and the second resistor code.

15. The method of claim 14, further comprising:
generating, by the first logic circuit, a signal to the second output,
wherein the signal to the second output comprises the second resistor code.

16. The method of claim 15, wherein the generating the first resistor code and the generating the second resistor code comprises:
generating, by a main logic circuit, a third resistor code;
generating, by a first post-adjustment circuit, the first resistor code from the third resistor code; and
generating, by a second post-adjustment circuit, the second resistor code from the third resistor code.

17. The method of claim 14, further comprising:
generating, by a second logic circuit, the second resistor code,
wherein the second logic circuit is distinct from the first logic circuit.

18. The method of claim 14, wherein the first resistor category comprises Ron which is an input resistor for use in an input of data to a memory.

19. The method of claim 14, wherein the second resistor category comprises Rtt which is an output resistor for use in an output of data from a memory.

20. A system, comprising:
a memory device configured to store data, the memory device comprising:
a NAND memory array comprising a memory; and
a peripheral circuit coupled to the NAND memory array and comprising a circuit for ZQ resistor calibration, the circuit for ZQ resistor calibration comprising:
a first input configured to receive a first default configuration;
a second input configured to receive a first calibration value based on a first comparison;
a first output configured to provide a first resistor code for a first resistor category, the first resistor category comprising Ron which is an input resistor for use in an input of data to the memory of the NAND memory array;

a second output configured to provide a second resistor code for a second resistor category different from the first resistor category, the second resistor category comprising Rtt which is an output resistor for use in an output of data from the memory of the NAND memory array; and a first logic circuit configured to receive a signal from the first input and a signal from the second input, and provide a signal to the first output, wherein the signal to the first output comprises the first resistor code, wherein the first resistor code is different from the second resistor code; and a memory controller coupled to the memory device and configured to control the memory device.

* * * * *